(12) United States Patent
Shigihara

(10) Patent No.: US 7,415,054 B2
(45) Date of Patent: Aug. 19, 2008

(54) SEMICONDUCTOR LASER DEVICE

(75) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/674,727

(22) Filed: Feb. 14, 2007

(65) Prior Publication Data

US 2008/0112449 A1    May 15, 2008

(30) Foreign Application Priority Data

Nov. 9, 2006 (JP) ............................. 2006-303865

(51) Int. Cl.
*H01S 5/00* (2006.01)

(52) U.S. Cl. ................................. 372/43.01; 372/45.01

(58) Field of Classification Search ............... 372/45.01, 372/43.01
See application file for complete search history.

(56) References Cited

U.S. PATENT DOCUMENTS

2005/0169334 A1* 8/2005 Sato ............................ 372/45

FOREIGN PATENT DOCUMENTS

JP         2003-347679          5/2003

* cited by examiner

*Primary Examiner*—Dung T Nguyen
(74) *Attorney, Agent, or Firm*—Leydig, Voit & Mayer, Ltd.

(57) ABSTRACT

A semiconductor laser device includes first and second conductivity type cladding layer side guide layers disposed in direct contact with respective surfaces of an active layer, sandwiching the active layer; and first and second conductivity type cladding layers disposed in direct contact with the first and second conductivity type cladding layer side guide layer, respectively. The first and second conductivity type cladding layer side guide layers are InGaAsP which is lattice-matched to GaAs and have an As composition ratio more than 0 and not exceeding 0.3. The first and second conductivity type cladding layers are AlGaAs, having an Al composition ratio less than 1.0 and at least equal to an Al composition ratio at which refractive index of the AlGaAs is less than the refractive index of the InGaAsP.

2 Claims, 6 Drawing Sheets

SEMICONDUCTOR LASER DEVICE

BACKGROUND OF THE INVENTION

1. Field of the Invention

The present invention relates to a semiconductor laser device used as a pumping light source of a solid state laser such as an Nd doped YAG laser and a Yb doped YAG laser, a Yb doped fiber laser, an Er doped fiber amplifier, or the like.

2. Description of the Related Art

In order to provide a semiconductor laser device which is highly reliable when operated at high power, InGaAsP which has a high optical damage threshold and which can decrease the electrical resistance is adopted as an active layer. The InGaAsP active layer is sandwiched between an InGaP guide layer and an allegiant clad layer (see, for example, Hirofumi Kan and three others, "High Power Laser and Applications for Energy Source", Trans. IEE Japan, Vol. 125-C, No. 2, 2005, pp. 187-194).

However, in recent years, in order to decrease the power consumption, the necessity of a semiconductor laser having high electrical transduction efficiency is growing. Improvement in internal quantum efficiency and improvement in slope efficiency by decreasing losses have almost reached a limit. There is still a problem of lowering the operating voltage. However, if, like in a conventional semiconductor laser having an oscillation wavelength of 808 nm, an InGaP layer which is lattice-matched to GaAs at a thickness of 120 nm is included between an active layer and a clad layer, there is a problem in that the operating voltage is raised.

SUMMARY OF THE INVENTION

An object of the present invention is to provide a semiconductor laser device which is highly reliable when operated at high power and which has a low operating voltage.

According to the present invention, there is provided a semiconductor laser device including: an active layer; a first conductivity type clad layer side guide layer disposed to be in direct contact with one surface of the active layer; a second conductivity type clad layer side guide layer disposed to be in direct contact with the other surface of the active layer, the first conductivity type clad layer side guide layer and the second conductivity type clad layer side guide layer sandwiching the active layer; a first conductivity type clad layer disposed to be in direct contact with the first conductivity type clad layer side guide layer; and a second conductivity type clad layer disposed to be in direct contact with the second conductivity type clad layer side guide layer. In the semiconductor laser device, the first conductivity type clad layer side guide layer and the second conductivity type clad layer side guide layer are InGaAsP which is lattice-matched to GaAs and an As composition ratio of which is more than 0 and equal to or less than 0.3, and the first conductivity type clad layer and the second conductivity type clad layer are AlGaAs the Al composition ratio of which is equal to or more than an Al composition ratio, with which a refractive index of the AlGaAs is less than the refractive index of the InGaAsP, and is less than 1.0.

In the semiconductor laser device according to the present invention, the first conductivity type clad layer side guide layer and the second conductivity type clad layer side guide layer are made of InGaAsP, and the refractive index of the first conductivity type clad layer and the second conductivity type clad layer made of AlGaAs is equal to or lower than the refractive index of InGaAsP. Therefore, an InGaP layer which is lattice-matched to GaAs is not included between the active layer and the clad layers, voltage applied to an pn junction is lowered, the electrical resistance is decreased because of the high conductivity, and thus, the operating voltage of the semiconductor laser can be lowered.

DETAILED DESCRIPTION OF THE PREFERRED EMBODIMENTS

Embodiment 1

Figure 1:
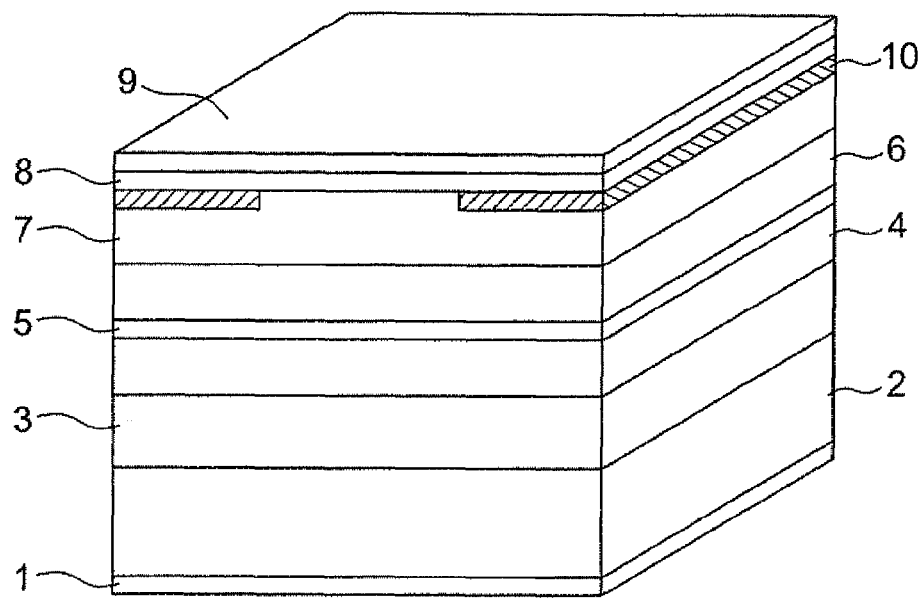
FIG. 1 is a perspective view of a semiconductor laser device according to Embodiment 1 of the present invention.

FIG. 1 is a perspective view of a semiconductor laser device according to Embodiment 1 of the present invention.

In the semiconductor laser device according to Embodiment 1 of the present invention, an n-type GaAs substrate 2 is provided, and an n-type $Al_XGa_{1-X}As$ clad layer 3 as a first conductivity type clad layer, an n-side $In_{1-Z}Ga_ZAs_yP_{1-y}$ guide layer 4 (the As composition ratio y is a real number which is more than 0 and equal to or less than 0.3) as a first conductivity type clad layer side guide layer, a $GaAs_{0.88}P_{0.12}$ active layer 5, a p-side $In_{1-Z}Ga_ZAs_yP_{1-y}$ guide layer 6 (the As composition ratio y is a real number which is more than 0 and equal to or less than 0.3) as a second conductivity type clad layer side guide layer, a p-type $Al_XGa_{1-X}As$ clad layer 7 as a second conductivity type clad layer, and a p-type GaAs contact layer 8 are disposed on a front surface of the n-type GaAs substrate 2 in sequence from the side of the n-type GaAs substrate 2.

It is to be noted that the GaAs substrate 2 is made of gallium arsenide (GaAs), the n-type $Al_XGa_{1-X}As$ clad layer 3 and the p-type $Al_XGa_{1-X}As$ clad layer 7 are made of ternary mixed crystals of gallium arsenide and aluminum arsenide (AlAs), and the n-side $In_{1-Z}Ga_ZAs_yP_{1-y}$ guide layer 4 and the p-side $In_{1-Z}Ga_ZAs_yP_{1-y}$ guide layer 6 are made of quaternary mixed crystals of gallium arsenide and indium phosphide (InP).

Proton-implanted regions 10 for narrowing the current are disposed on both sides of a stripe left at the center of the device width where current flows. Protons are implanted in a depth direction of the proton-implanted regions 10 from a surface of the p-type GaAs contact layer 8 to approximately the midpoint of the thickness of the p-type $Al_xGa_{1-x}As$ clad layer 7. Further, a p electrode 9 is disposed on the surface of the p-type GaAs contact layer 8.

Further, an n electrode 1 is formed on a rear surface side of the n-type GaAs substrate 2.

According to Takahashi and six others, "Fabrication methods for InGaAsP/GaAs visible laser structure with AlGaAs burying layers grown by liquid-phase epitaxy", J. Appl. Phys., Vol. 59, No. 3, Feb. 1, 1986, pp. 761-768, Z=(0.2155+ 0.1896y)/(0.4176−0.0125y) holds between the As composition ratio y and the Ga composition ratio Z of $In_{1-Z}Ga_ZAs_yP_{1-y}$ which is lattice-matched to GaAs.

With regard to the $GaAs_{0.88}P_{0.12}$ active layer 5, in order to make the oscillation wavelength about 808 nm, generally the P composition ratio is about 0.12 and the thickness is about 12 nm, but the present invention is not limited thereto.

Further, protons have the function of making higher the resistance of a region where the protons are implanted, current avoids the proton-implanted regions 10 and flows through a region where the protons are not implanted.

Voltage-current characteristics was simulated when the Al composition ratio X of the n-type $Al_xGa_{1-x}As$ clad layer 3 and the p-type $Al_xGa_{1-x}As$ clad layer 7 was 0.50, the As composition ratio y and the Ga composition ratio Z of the n-side $In_{1-Z}Ga_ZAs_yP_{1-y}$ guide layer 4 and the p-side $In_{1-Z}Ga_ZAs_yP_{1-y}$ guide layer 6 were 0.1 and 0.56, respectively, the layer thickness was 200 nm, the resonator length was 1000 μm, and the stripe width was 1 μm.

Figure 2:
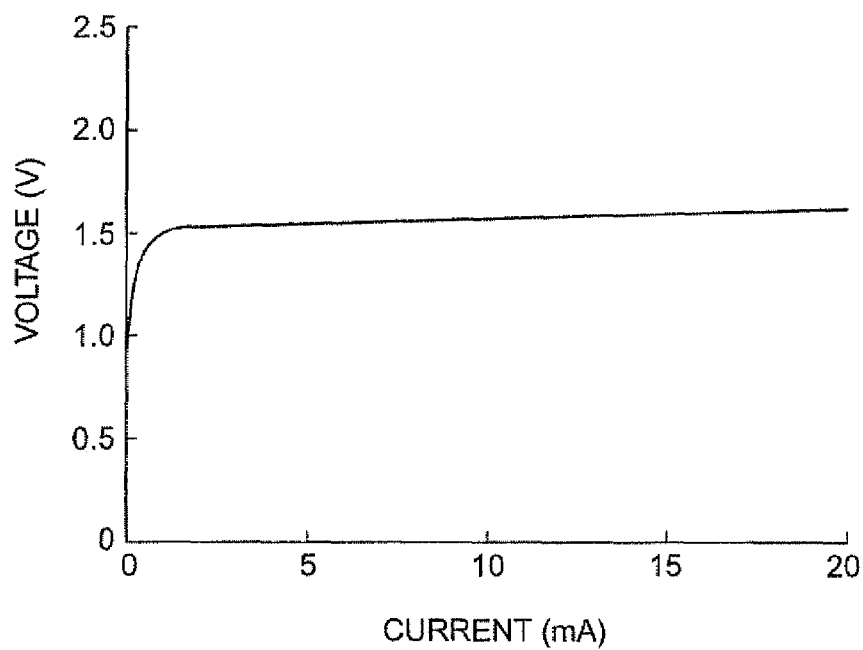
FIG. 2 is a graph illustrating voltage-current characteristics of the semiconductor laser device according to Embodiment 1.

The result of the simulation is shown in FIG. 2. When the injection current is 20 mA, the operating voltage is determined to be 1.624 V.

Next, the As composition ratio y and the Ga composition ratio Z of the n-side $In_{1-Z}Ga_ZAs_yP_{1-y}$ guide layer 4 and the p-side $In_{1-Z}Ga_ZAs_yP_{1-y}$ guide layer 6 were made to be 0.10 and 0.56, respectively. The dependence of operating voltage on guide layer thickness when the injection current was 20 mA was determined with the Al composition ratio X of the n-type $Al_xGa_{1-x}As$ clad layer 3 and the p-type $Al_xGa_{1-x}As$ clad layer 7 being the parameter. As the Al composition ratio X, 0.40, 0.50, 0.70, and 1.0 were adopted.

Figure 3:
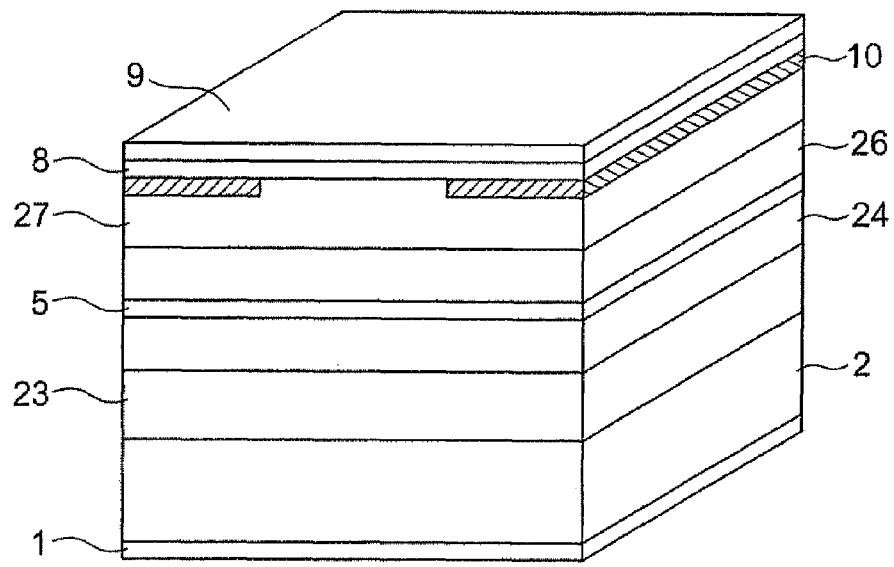
FIG. 3 is a perspective view of a semiconductor laser device having a conventional structure.

Further, in order to compare the structures according to Embodiment 1 with a conventional structure, the dependence of operating voltage on guide layer thickness of a semiconductor laser device as illustrated in FIG. 3 as the conventional structure having an n-side $In_{1-Z}Ga_ZAs_yP_{1-y}$ guide layer 24 and a p-side $In_{1-Z}Ga_ZAs_yP_{1-y}$ guide layer 26 the As composition ratio y of which was 0.1 and the Ga composition ratio Z of which was 0.56, an n-type $Al_{0.15}Ga_{0.35}In_{0.50}P$ clad layer 23, and a p-type $Al_{0.15}Ga_{0.35}In_{0.50}P$ clad layer 27 was determined.

Figure 4:
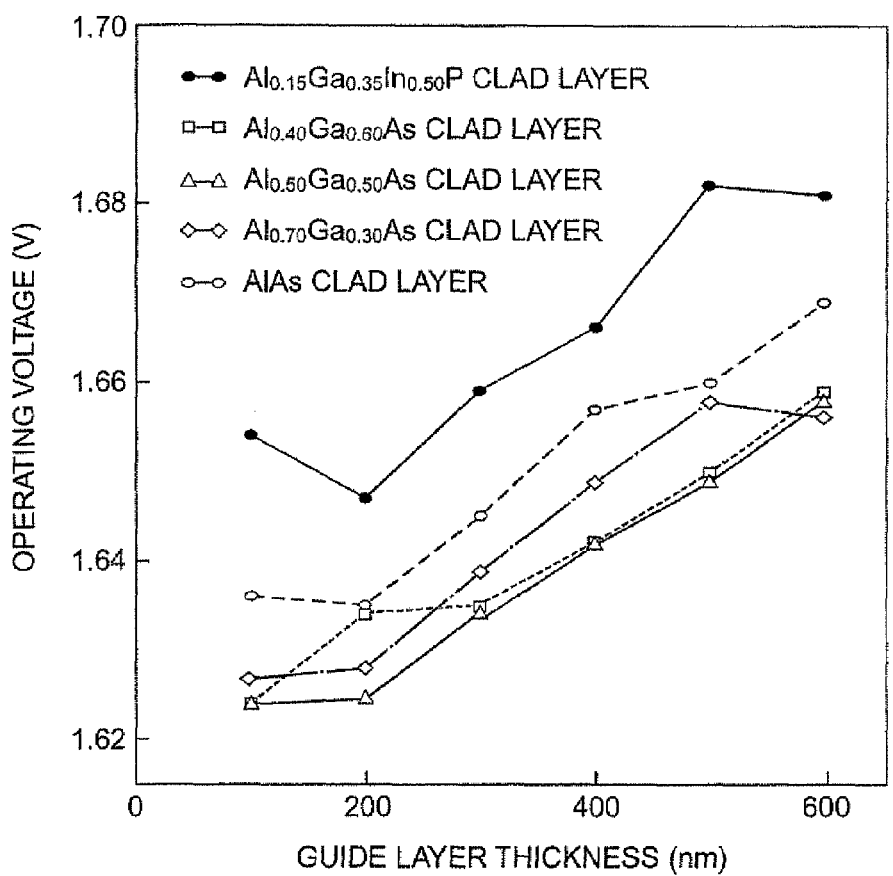
FIG. 4 is a graph illustrating the dependence of operating voltage on guide layer thickness of the semiconductor laser device according to Embodiment 1.

The result of the simulation is illustrated in FIG. 4. It is found that, with regard to every guide layer thickness, the operating voltage of the structures according to Embodiment 1 is lower than that of the conventional structure.

Next, with reference to Kenichi Iga (Ed.), "Applied Physics Series Semiconductor Laser", Ohmsha, Ltd., Oct. 25, 1994, pp. 35-38, the relationship between the As composition ratio y of $In_{1-Z}Ga_ZAs_yP_{1-y}$ and the Al composition ratio X of $Al_xGa_{1-x}As$ in order to make the refractive index of the n-side $In_{1-Z}Ga_ZAs_yP_{1-y}$ guide layer 4 equal to the refractive index of the n-type $Al_xGa_{1-x}As$ clad layer 3 when the wavelength is 808 nm was determined.

Figure 5:
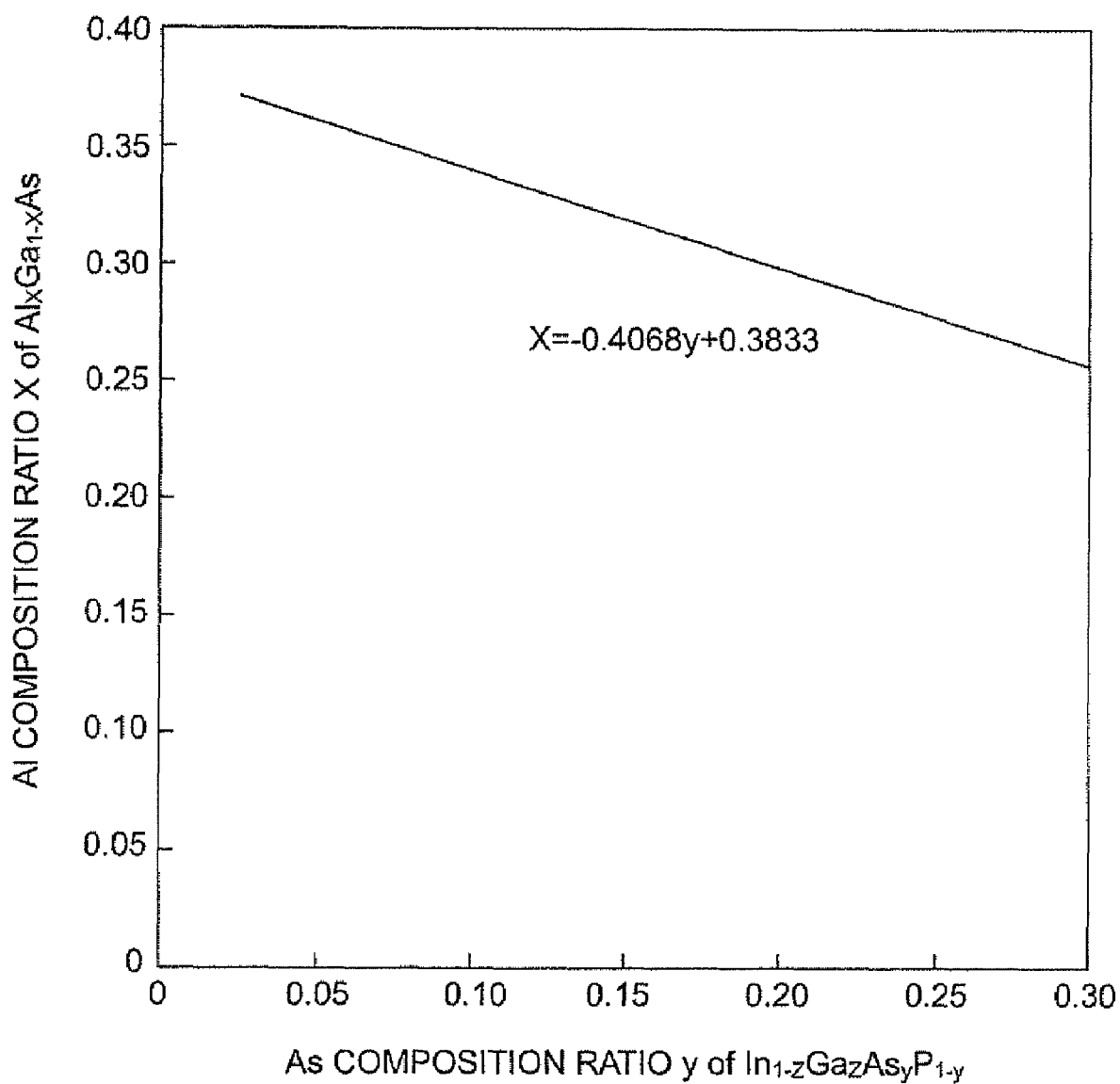
FIG. 5 is a graph illustrating a relationship between As composition ratio y of $In_{1-Z}Ga_ZAs_yP_{1-y}$ and Al composition ratio X of $Al_XGa_{1-X}As$ of a semiconductor laser device having an oscillation wavelength of 808 nm when the refractive index of an $In_{1-Z}Ga_ZAs_yP_{1-y}$ guide layer and the refractive index of an $Al_XGa_{1-X}As$ clad layer are the same.

The determined relationship is illustrated in FIG. 5. The refractive indexes of the two are the same when X equals to −0.4068y plus 0.3833. For example, the Al composition ratio X of $Al_xGa_{1-x}As$ having the same refractive index as the refractive index of $In_{1-Z}Ga_ZAs_yP_{1-y}$ the As composition ratio y of which is 0.10 is 0.343. The refractive index of $Al_xGa_{1-x}As$ As the Al composition ratio X of which is lower than this is more than the refractive index of $In_{1-Z}Ga_ZAs_yP_{1-y}$ the As composition ratio y of which is 0.10, and thus, light cannot be effectively confined in the n-side $In_{1-Z}Ga_ZAs_yP_{1-y}$ guide layer 4. Therefore, in Embodiment 1, the lower limit of the Al composition ratio X of the n-type $Al_xGa_{1-x}As$ clad layer 3 is 0.343. It is to be noted that, with regard to the p-side $In_{1-Z}Ga_ZAs_yP_{1-y}$ guide layer 6 and the p-type $Al_xGa_{1-x}As$ clad layer 7, similarly, the lower limit of the Al composition ratio X of the p-type $Al_xGa_{1-x}As$ clad layer 7 is 0.343.

In Embodiment 1, the thickness of the $In_{1-Z}Ga_ZAs_yP_{1-y}$ guide layer is 100 nm or more in order to, by confining more light in the undoped $In_{1-Z}Ga_ZAs_yP_{1-y}$ guide layer, decrease losses due to light absorption to allow high efficiency operation. It is to be noted that, because the diffusion length of the carriers is about 2 to 3 μm, an appropriate upper limit of the thickness of the $In_{1-Z}Ga_ZAs_yP_{1-y}$ guide layer is half thereof i.e., 1 to 1.5 μm.

Such a semiconductor laser device uses as the guide layers $In_{1-Z}Ga_ZAs_yP_{1-y}$ which is lattice-matched to the GaAs substrate 2, and uses as the clad layers $Al_xGa_{1-x}As$ the Al composition ratio of which is more than the Al composition ratio with which the refractive index is less than the refractive index of the guide layers, and thus, a semiconductor laser which has a low operating voltage and has an oscillation wavelength of 808 nm can be materialized.

Further, although, in Embodiment 1, the Al composition ratio of the n-type $Al_xGa_{1-x}As$ clad layer 3 and the Al composition ratio of the p-type $Al_xGa_{1-x}As$ clad layer 7 are the same, they are not necessarily the same. However, by making the same the Al composition ratios of the two, the light distribution becomes symmetrical, and, for example, the efficiency of incidence to a YAG rod becomes higher.

Embodiment 2

A semiconductor laser device according to Embodiment 2 of the present invention is similar to the semiconductor laser device according to Embodiment 1 except for the As composition ratio y and the Ga composition ratio Z of the n-side $In_{1-Z}Ga_ZAs_yP_{1-y}$ guide layer 4 and the p-side $In_{1-Z}Ga_ZAs_yP_{1-y}$ guide layer 6, and thus, like numerals are used to designate like or identical members and description thereof is omitted.

The As composition ratio y and the Ga composition ratio Z of the n-side $In_{1-Z}Ga_ZAs_yP_{1-y}$ guide layer 4 and the p-side $In_{1-Z}Ga_ZAs_yP_{1-y}$ guide layer 6 according to Embodiment 2 are 0.20 and 0.61, respectively.

Here, the dependence of operating voltage on guide layer thickness when the injection current was 20 mA was determined with the Al composition ratio X of the n-type $Al_xGa_{1-x}As$ clad layer 3 and the p-type $Al_xGa_{1-x}As$ clad layer 7 being the parameter. As the composition ratio X of the parameter, 0.35, 0.50, 0.70, and 1.00 were adopted.

In order to compare the structures according to Embodiment 2 with a conventional structure, the dependence of operating voltage on guide layer thickness of a semiconductor laser device was determined also in a case of conventional structure as illustrated in FIG. 3 where the As composition ratio y of an n-side $In_{1-Z}Ga_ZAs_yP_{1-y}$ guide layer 24 and a p-side $In_{1-Z}Ga_ZAs_yP_{1-y}$ guide layer 26 was set to 0.2 and the Ga composition ratio Z thereof was set to 0.61, and an n-type $Al_{0.15}Ga_{0.35}In_{0.50}P$ clad layer 23, and a p-type $Al_{0.15}Ga_{0.35}In_{0.50}P$ clad layer 27 was employed.

Figure 6:
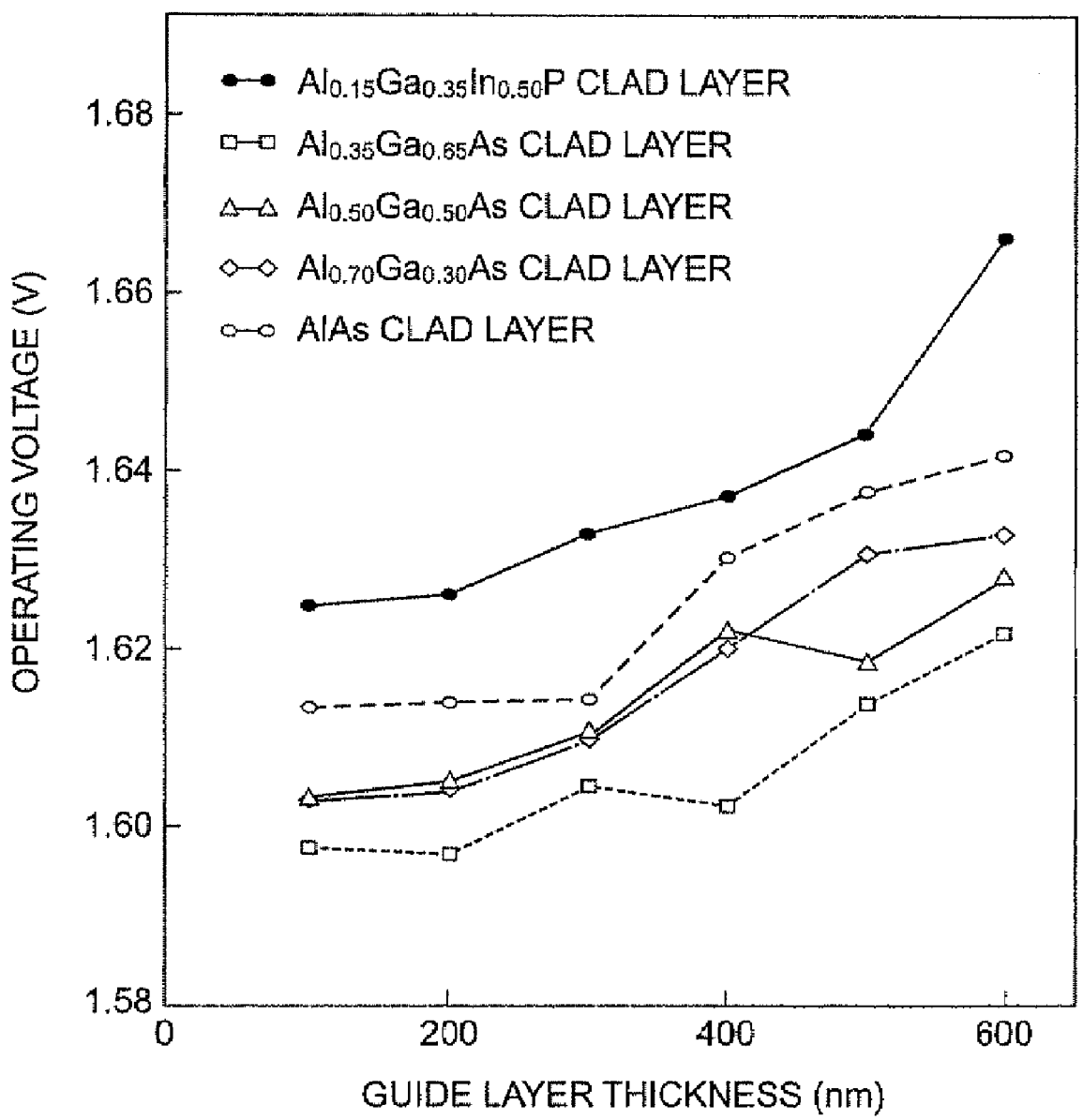
FIG. 6 is a graph illustrating the dependence of operating voltage on guide layer thickness of a semiconductor laser device according to Embodiment 2 of the present invention.

The result of the simulation is illustrated in FIG. 6. It is found that, with any guide layer thickness, the operating voltage of the structures according to Embodiment 1 is lower than that of the conventional structure.

Next, with reference to Kenichi Iga (Ed.), "Applied Physics Series Semiconductor Laser", Ohmsha, Ltd., Oct. 25, 1994, pp. 35-38, the relationship between the As composition ratio y of $In_{1-z}Ga_zAs_yP_{1-y}$ and the Al composition ratio X of $Al_xGa_{1-x}As$ in order to make the refractive index of the n-side $In_{1-z}Ga_zAs_yP_{1-y}$ guide layer 4 equal to the refractive index of the n-type $Al_xGa_{1-x}As$ clad layer 3 when the wavelength is 808 nm was determined. From the determined relationship, the refractive indexes of the two are the same when $X=-0.4068y+0.3833$ is satisfied. For example, The Al composition ratio X of $Al_xGa_{1-x}As$ having the same refractive index as the refractive index of $In_{1-z}Ga_zAs_yP_{1-y}$ the As composition ratio y of which is 0.20 is 0.302. The refractive index of $Al_xGa_{1-x}As$ the Al composition ratio X of which is equal to or lower than the value is more than the refractive index of $In_{1-z}Ga_zAs_yP_{1-y}$ the As composition ratio y of which is 0.20. Thus, light cannot be effectively confined in the n-side $In_{1-z}Ga_zAs_yP_{1-y}$ guide layer 4. Therefore, in Embodiment 2, the lower limit of the Al composition ratio X of the n-type $Al_xGa_{1-x}As$ clad layer 3 is 0.302. It is to be noted that, with regard to the p-side $In_{1-z}Ga_zAs_yP_{1-y}$ guide layer 6 and the p-type $Al_xGa_{1-x}As$ clad layer 7, similarly, the lower limit of the Al composition ratio X of the p-type $Al_xGa_{1-x}As$ clad layer 7 is 0.302.

With regard to the semiconductor laser device according to Embodiment 2, even when the As composition ratio and the Ga composition ratio of $In_{1-z}Ga_zAs_yP_{1-y}$ as the guide layer are 0.20 and 0.61, respectively, by using the n-type $Al_xGa_{1-x}As$ clad layer 3 and the p-type $Al_xGa_{1-x}As$ clad layer 7 which are lattice-matched to the GaAs substrate 2, the semiconductor laser device can operate at an operating voltage lower than the operating voltage of the conventional structure the clad layers of which are $Al_{0.15}Ga_{0.35}In_{0.50}P$.

Embodiment 3

A semiconductor laser device according to Embodiment 3 of the present invention is similar to the semiconductor laser device according to Embodiment 1 except for the As composition ratio y and the Ga composition ratio Z of the n-side $In_{1-z}Ga_zAs_yP_{1-y}$ guide layer 4 and the p-side $In_{1-z}Ga_zAs_yP_{1-y}$ guide layer 6, and thus, like numerals are used to designate like or identical members and description thereof is omitted.

The As composition ratio y and the Ga composition ratio Z of the n-side $In_{1-z}Ga_zAs_yP_{1-y}$ guide layer 4 and the p-side $In_{1-z}Ga_zAs_yP_{1-y}$ guide layer 6 according to Embodiment 3 are 0.30 and 0.66, respectively.

Here, the dependence of operating voltage on guide layer thickness when the injection current was 20 mA was determined with the Al composition ratio X of the n-type $Al_xGa_{1-x}As$ clad layer 3 and the p-type $Al_xGa_{1-x}As$ clad layer 7 being the parameter. As the composition ratio X as the parameter, 0.30, 0.50, 0.70, and 1.00 were adopted.

In order to compare the structures according to Embodiment 3 with a conventional structure, the dependence of operating voltage on guide layer thickness of a semiconductor laser device was determined also in a case of the conventional structure as illustrated in FIG. 3 where the As composition ratio y of an n-side $In_{1-z}Ga_zAs_yP_{1-y}$ guide layer 24 and a p-side $In_{1-z}Ga_zAs_yP_{1-y}$ guide layer 26 was set to 0.3 and the Ga composition ratio Z thereof was set to 0.66, and an n-type $Al_{0.15}Ga_{0.35}In_{0.50}P$ clad layer 23 and a p-type $Al_{0.15}Ga_{0.35}In_{0.50}P$ clad layer 27 were employed.

Figure 7:
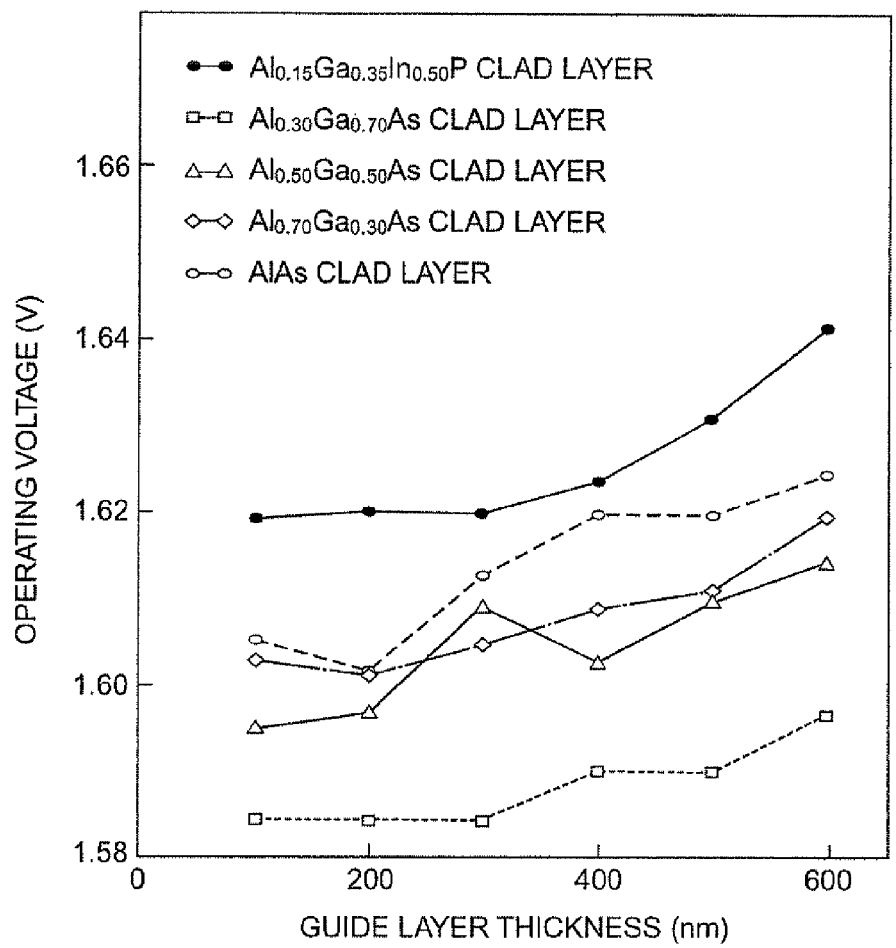
FIG. 7 is a graph illustrating the dependence of operating voltage on guide layer thickness of a semiconductor laser device according to Embodiment 3 of the present invention.

The result of the simulation is illustrated in FIG. 7. It is found that, with any guide layer thickness, the operating voltage of the structures according to Embodiment 1 is lower than that of the conventional structure.

Next, with reference to Kenichi Iga (Ed.), "Applied Physics Series Semiconductor Laser", Ohmsha, Ltd., Oct. 25, 1994, pp. 35-38, the relationship between the As composition ratio y of $In_{1-z}Ga_zAs_yP_{1-y}$ and the Al composition ratio X of $Al_xGa_{1-x}As$ in order to make the refractive index of the n-side $In_{1-z}Ga_zAs_yP_{1-y}$ guide layer 4 equal to the refractive index of the n-type $Al_xGa_{1-x}As$ clad layer 3 when the wavelength is 808 nm was determined. From the determined relationship, the refractive indexes of the two are the same when $X=-0.4068y+0.3833$ is satisfied. For example, The Al composition ratio X of $Al_xGa_{1-x}As$ having the same refractive index as the refractive index of $In_{1-z}Ga_zAs_yP_{1-y}$ the As composition ratio y of which is 0.30 is 0.261. The refractive index of $Al_xGa_{1-x}As$ the Al composition ratio X of which is equal to or lower than the value is more than the refractive index of $In_{1-z}Ga_zAs_yP_{1-y}$ the As composition ratio y of which is 0.30. Thus, light cannot be effectively confined in the n-side $In_{1-z}Ga_zAs_yP_{1-y}$ guide layer 4. Therefore, in Embodiment 3, the lower limit of the Al composition ratio X of the n-type $Al_xGa_{1-x}As$ clad layer 3 is 0.261. It is to be noted that, with regard to the p-side $In_{1-z}Ga_zAs_yP_{1-y}$ guide layer 6 and the p-type $Al_xGa_{1-x}As$ clad layer 7, similarly, the lower limit of the Al composition ratio X of the p-type $Al_xGa_{1-x}As$ clad layer 7 is 0.261.

With regard to the semiconductor laser device according to Embodiment 3, even when the As composition ratio y and the Ga composition ratio Z of $In_{1-z}Ga_zAs_yP_{1-y}$ as the guide layer are 0.30 and 0.66, respectively, by using the n-type $Al_xGa_{1-x}As$ clad layer 3 and the p-type $Al_xGa_{1-x}As$ clad layer 7 which are lattice-matched to the GaAs substrate 2, the semiconductor laser device can operate at an operating voltage lower than the operating voltage of the conventional structure the clad layers of which are $Al_{0.15}Ga_{0.35}In_{0.50}P$.

It is to be noted that, in the above Embodiments 1 to 3, semiconductor laser devices which have the GaAsP active layer the P composition ratio of which is 0.12 and which have an oscillation wavelength of 808 nm are described. The present invention can also be applied to semiconductor laser devices which use GaAsP, AlGaAs, InGaAsP, or the like the P composition ratio of which is other than 0.12 as the active layer and which have an oscillation wavelength of 760 nm to 830 nm. In those cases, the relational expression between the As composition ratio y of InGaAsP and the Al composition ratio X of AlGaAs in order to make the refractive index of the InGaAsP guide layers and the refractive index of the AlGaAs clad layers equal to each other is not $X=-0.4068y+0.3833$. However, with reference to Kenichi Iga (Ed.), "Applied Physics Series Semiconductor Laser", Ohmsha, Ltd., Oct. 25, 1994, pp. 35-38, the relational expression can be derived with ease.

Further, in the above Embodiments 1 to 3, description is made with regard to cases where the As composition ratio y of the $In_{1-z}Ga_zAs_yP_{1-y}$ guide layers is 0.10, 0.20, or 0.30. It is clarified that the operating voltage can be suppressed when, as a whole, the As composition ratio is more than 0 and 0.3 or less. Further, even with the $In_{1-z}Ga_zAs_yP_{1-y}$ guide layers the As composition ratio of which is more than 0.3, the operating voltage can be suppressed. However, in this case, because the band gap energy difference between the active layer and the guide layers is small, the carriers cannot be effectively confined in the active layer, which results in decrease in efficiency, i.e., deteriorates laser characteristics. Therefore, the practical upper limit of the As composition ratio is 0.3.

Still further, in the above Embodiments 1 to 3, an exemplary case where the resonator length is 1000 μm and the stripe width is 1 μm is described, but it goes without saying that the present invention is not limited thereto.

Embodiment 4

Figure 8:
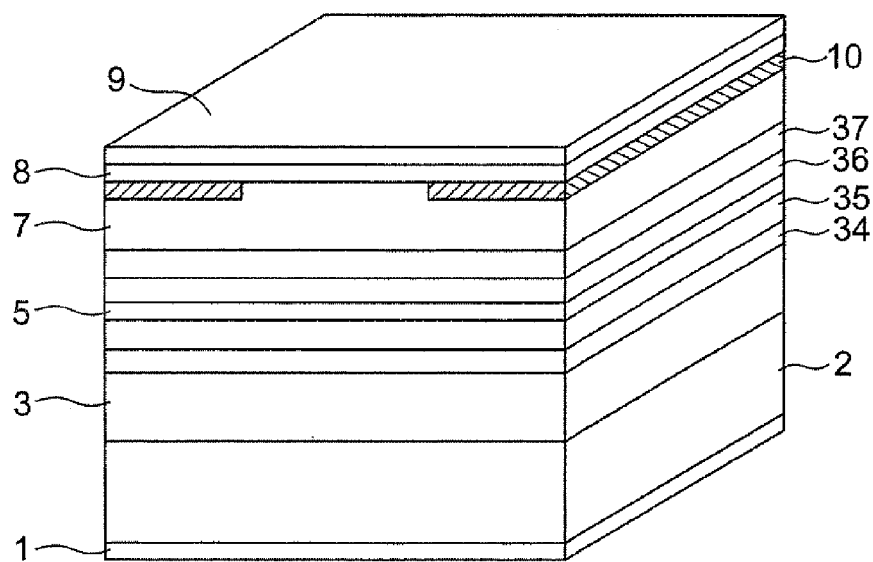
FIG. 8 is a perspective view of a semiconductor laser device according to Embodiment 4 of the present invention.

FIG. 8 is a perspective view of a semiconductor laser device according to Embodiment 4 of the present invention.

The semiconductor laser device according to Embodiment 4 of the present invention is similar to the semiconductor laser device according to Embodiment 1 except that an outer n-side $In_{1-t}Ga_tAs_sP_{1-s}$ (the As composition ratio s is a real number which is more than 0 and equal to or less than 0.3) guide layer 34 and an inner n-side $In_{1-w}Ga_wAs_uP_{1-u}$ (the As composition ratio u is a real number which is more than s, more than 0, and equal to or less than 0.3) guide layer 35 are used instead of the n-side $In_{1-z}Ga_zAs_yP_{1-y}$ guide layer 4 as the first conductivity type clad layer side guide layer, and an inner p-side $In_{1-w}Ga_wAs_uP_{1-u}$ guide layer 36 and an outer p-side $In_{1-t}Ga_tAs_sP_{1-s}$ guide layer 37 are used instead of the p-side $In_{1-z}Ga_zAs_yP_{1-y}$ guide layer 6 as the second conductivity type clad layer side guide layer. Thus, like numerals are used to designate like or identical members and description thereof is omitted. For example, when u=0.3 and s=0.1, the Al composition ratio x of the n-type $Al_xGa_{1-x}As$ clad layer 3 and the p-type $Al_xGa_{1-x}As$ clad layer 7 may be 0.343 or more and 1.0 or less.

In this way, even if the first conductivity type clad layer side guide layer and the second conductivity type clad layer side guide layer are formed of a plurality of layers, respectively, the As composition ratios of which are different from each other, a semiconductor laser which has a low operating voltage and has an oscillation wavelength of 808 nm can be realized.

It is to be noted that, in Embodiment 4, the first conductivity type clad layer side guide layer and the second conductivity type clad layer side guide layer are formed of two layers the As composition ratios of which are different from each other, respectively, they may be formed of three or more layers the As composition ratios of which are different from one another.

Embodiment 5

Figure 9:
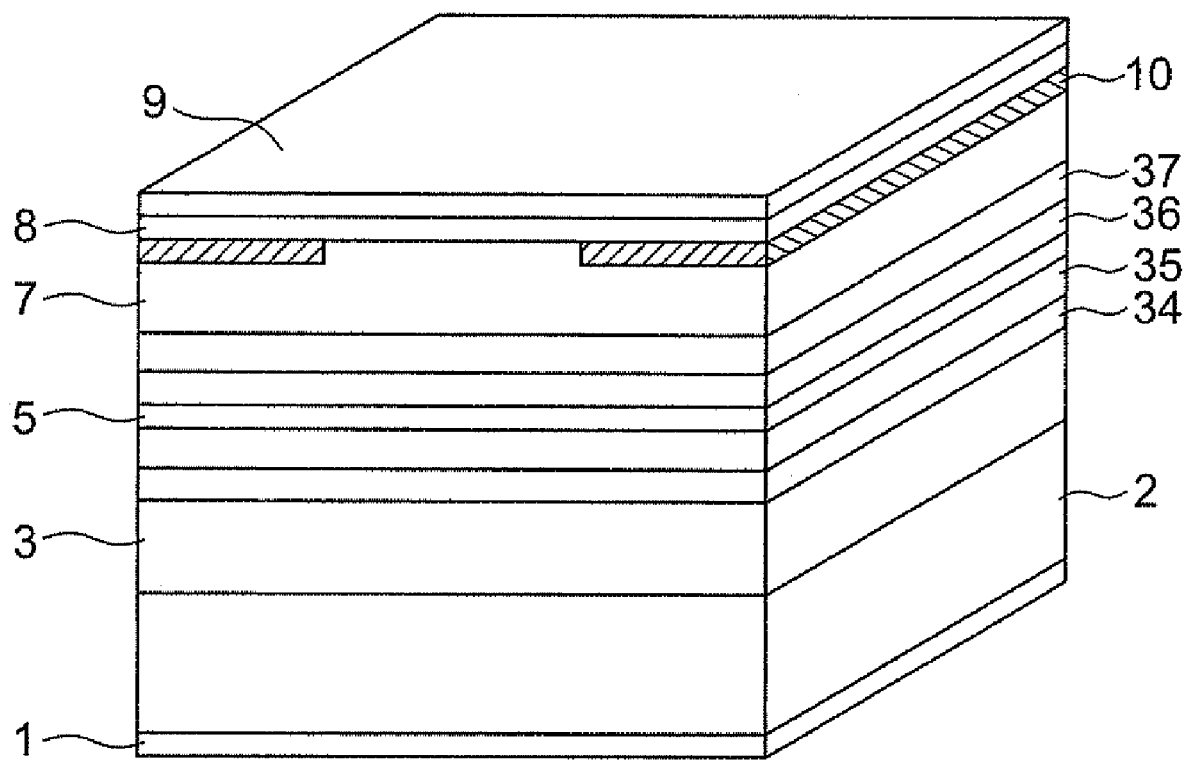
FIG. 9 is a perspective view of a semiconductor laser device according to Embodiment 5 of the present invention.

FIG. 9 is a perspective view of a semiconductor laser device according to Embodiment 5 of the present invention.

The semiconductor laser device according to Embodiment 5 of the present invention is similar to the semiconductor laser device according to Embodiment 1 except that an outer n-side $In_{1-t}Ga_tAs_sP_{1-s}$ (the As composition ratio s is a real number which is more than 0 and equal to or less than 0.3) guide layer 34 and an inner n-side $In_{1-w}Ga_wAs_uP_{1-u}$ (the As composition ratio u is a real number which is less than s, more than 0, and equal to or less than 0.3) guide layer 35 are used instead of the n-side $In_{1-z}Ga_zAs_yP_{1-y}$ guide layer 4 as the first conductivity type clad layer side guide layer, and an inner p-side $In_{1-w}Ga_wAs_uP_{1-u}$ guide layer 36 and an outer p-side $In_{1-t}Ga_tAs_sP_{1-s}$ guide layer 37 are used instead of the p-side $In_{1-z}Ga_zAs_yP_{1-y}$ guide layer 6 as the second conductivity type clad layer side guide layer. Thus, like numerals are used to designate like or identical members and description thereof is omitted. For example, when u=0.1 and s=0.3, the Al composition ratio x of the n-type $Al_xGa_{1-x}As$ clad layer 3 and the p-type $Al_xGa_{1-x}As$ clad layer 7 may be 0.261 or more and 1.0 or less.

In this way, even if the first conductivity type clad layer side guide layer and the second conductivity type clad layer side guide layer are formed of a plurality of layers, respectively, the As composition ratios of which are different from each other, a semiconductor laser which has a low operating voltage and has an oscillation wavelength of 808 nm can be realized.

It is to be noted that, in Embodiment 5, the first conductivity type clad layer side guide layer and the second conductivity type clad layer side guide layer are formed of two layers the As composition ratios of which are different from each other, respectively, but they may be formed of three or more layers the As composition ratios of which are different from one another.

The invention claimed is:

1. A semiconductor laser device, comprising:
   an active layer;
   a first conductivity type cladding layer side guide layer disposed in direct contact with a first surface of the active layer;
   a second conductivity type cladding layer side guide layer disposed in direct contact with a second surface of the active layer, the first conductivity type cladding layer side guide layer and the second conductivity type cladding layer side guide layer sandwiching the active layer;
   a first conductivity type cladding layer disposed in direct contact with the first conductivity type cladding layer side guide layer; and
   a second conductivity type cladding layer disposed in direct contact with the second conductivity type cladding layer side guide layer, wherein
   the first conductivity type cladding layer side guide layer and the second conductivity type cladding layer side guide layer comprise InGaAsP which is lattice-matched to GaAs and has an As composition ratio more than 0 and not exceeding 0.3,
   the first conductivity type cladding layer and the second conductivity type cladding layer comprise AlGaAs having an Al composition ratio less than 1.0 and at least equal to an Al composition ratio at which refractive index of the AlGaAs is less than the refractive index of the InGaAsP of the first conductivity type cladding layer side guide layer and the second conductivity type cladding layer side guide layer,
   at least one of the first conductivity type cladding layer side guide layer and the second conductivity type cladding layer side guide layer comprises a plurality of InGaAsP layers, the As composition ratios of which are different from each other, and
   the semiconductor laser produces light having a wavelength in a range from 760 nm to 830 nm.

2. The semiconductor laser device according to claim 1, wherein one of the first conductivity type cladding layer side guide layer and the second conductivity type cladding layer side guide layer is at least 100 nm in thickness.

* * * * *